United States Patent [19]

Doue et al.

[11] Patent Number: 4,971,676
[45] Date of Patent: Nov. 20, 1990

[54] SUPPORT DEVICE FOR A THIN SUBSTRATE OF A SEMICONDUCTOR MATERIAL

[75] Inventors: Julien Doue, Liancourt; Jacky Beauvineau, Igny, both of France

[73] Assignee: Centre National d'Etudes des Telecomunications, Issy les Muolineaux, France

[21] Appl. No.: 365,861

[22] Filed: Jun. 14, 1989

[30] Foreign Application Priority Data

Jun. 28, 1988 [FR] France ................................. 88 08667

[51] Int. Cl.$^5$ ..................... C25D 17/08; C25D 17/06; C25D 17/04
[52] U.S. Cl. .......................... 204/297 R; 204/297 W; 204/298.09; 204/298.15; 357/74; 357/79; 118/503; 269/903
[58] Field of Search .................... 357/74, 79; 174/52.4; 204/298 CS, 298 WH, 192.33, 297 R, 297 W; 156/D98; 361/399, 413

[56] References Cited

U.S. PATENT DOCUMENTS

| | | | |
|---|---|---|---|
| 3,452,254 | 6/1969 | Boyer | 357/79 |
| 3,777,955 | 8/1976 | Nevis et al. | 204/192 |
| 4,298,443 | 11/1981 | Maydan | 204/192 E |
| 4,306,731 | 12/1981 | Shaw | 279/4 |
| 4,367,114 | 1/1983 | Steinberg et al. | 156/345 |
| 4,391,938 | 7/1983 | Harra et al. | 204/298 |
| 4,404,582 | 9/1983 | Pollard et al. | 357/79 |
| 4,435,724 | 3/1984 | Ralstin | 357/79 |
| 4,473,455 | 9/1984 | Dean et al. | 204/298 |
| 4,607,275 | 8/1986 | Vogt et al. | 357/79 |
| 4,769,744 | 9/1988 | Neugebauer et al. | 361/386 |

FOREIGN PATENT DOCUMENTS 2571746 10/1984 France .
0102525 6/1983 Japan .
0079964 4/1988 Japan .

OTHER PUBLICATIONS

Patent Abstracts of Japan, vol. 7, No. 204 (E-197)[1349], Sep. 9, 1983; and JP-A-58 102 525 (Nippon Denki K.K.) Jun. 18, 1983.
Pat. Abstracts of Japan, vol. 12, No. 306 (C-522)[3153] 19 Aout 1988; & JP-A-63 79 964 (Ulvac Corp.) Apr. 9, 1988.

Primary Examiner—Rolf Hille
Assistant Examiner—David Ostrowski
Attorney, Agent, or Firm—Pollock, VandeSande & Priddy

[57] ABSTRACT

A support device for a thin substrate, notably in a semiconductor material, having the shape of a plate with a circular profile, including a platen provided with projecting fixed abutments against which bears the substrate, wherein the fixed abutments are disposed on said platen so as to define an open housing which the substrate is freely engaged. The platen includes a complementary movable abutment, adapted for retracting inside a recess formed in the platen thickness which allows for engagement of said substrate. Once said substrate has been placed in a position a contact is established with the fixed abutments bearing in a resilient way against the substrate edge holding it against the abutments.

6 Claims, 1 Drawing Sheet

SUPPORT DEVICE FOR A THIN SUBSTRATE OF A SEMICONDUCTOR MATERIAL

FIELD OF THE INVENTION

The present invention relates to a support device for a plaquette or a thin substrate of a semiconductor monocrystalline material, adapted for being placed in an appropriate heating enclosure so as to promote on this substrate an epitaxial growth, preferably by means of molecular jets, of the same material, doped or not.

BACKGROUND OF THE INVENTION

In standard preparation installations of semiconductor components, the substrate to be treated, notably by epitaxy, is mounted generally horizontally inside the enclosure of a reaction oven on a graphite or other material support, called a susceptor. The substrate is positioned in place against motion by studs distributed on the support periphery. These studs have generally a projecting head bearing on the substrate edges while the axes of these studs, after having crossed the support, are stopped by metallic pins extending laterally through them. As a variant, the studs may be replaced by a circular crown coming to bear on the substrate periphery or by a ring which is screwed or locked on the support by a bayonet or similar system.

Yet, these solutions have disadvantages, notably due to the fact that the positioning of the substrate and its immobilization require relatively lengthy and delicate operations, in particular for mounting the studs or the support crown. On the other hand, with a bayonet ring, the substrate is not perfectly fixed with respect to the support.

OBJECTS AND SUMMARY OF THE INVENTION

The present invention relates to a support device for a substrate which avoids these disadvantages, by allowing a reliable, rapid and efficient setting in position, with complete immobilization of the substrate. The invention allows an automation of the operations necessary to this positioning the substrate being always received in its support in a way position which remains constant.

To this effect, the support device in consideration, for is a substrate in the form of a thin plate of circular profile, and it includes a platen formed with projecting fixed abutments against which bears the substrate. The fixed abutments are disposed on the platen in such a way as to define an open housing in which the substrate is freely engaged. The platen includes a complementary movable abutment, adapted to retract in a recess formed in the thickness of the platen to allow the engagement of the substrate. Then, after positioning so that a contact is established with the fixed abutments, the mobile abutment is applied in a resilient manner against the edge of the substrate holding it firmly against said fixed abutments.

According to a particular feature of the invention, the fixed abutments are distributed on a face of the platen in order to come in engagement with three separated points of the substrate, two of which are disposed along a diameter of the substrate, the third, along a radius perpendicular to this diameter.

Advantageously, the platen includes in its open housing a circular recessed central zone, of a diameter slightly less than that of the substrate. The fixed abutments are made of rims fast with the platen and spaced apart the periphery of the central zone, said rims each including a first portion perpendicular to the platen plane and end into a second portion directed toward the center of the central zone in order to extend parallel to the substrate plane. The substrate, when put in position on the platen, is disposed above the central zone with its edge engaged underneath the rims of the fixed abutments.

According to another particular characteristic of the device, each rim of a fixed abutment defines between its second portion parallel to the platen plane and said platen a space the height of which is substantially equal to the substrate thickness.

Preferably, the complementary abutment is a stud, including an axis and a flat head perpendicular to this axis. The platen recess has dimensions corresponding to those of the stud head in order to allow retracting the latter inside the platen thickness. The stud axis extend freely through a passage communicating with the recess and is subjected to the effect of a spring tending to exert permanently on this stud a force pushing back the stud outside the recess in the direction of the substrate.

According to an additional characteristic, the stud axis ends into a flared out conical formation, provided opposite the flat head and on which is borne the spring secured against motion against the platen in an open groove formed in the latter outside the recess receiving the stud.

Advantageously, the spring has the shape of a hairpin, with a branch bearing on the bottom of the groove and the other forming a loop surrounding the stud.

Finally and according to still another characteristic of the device, the platen is preferably mounted on a fixed base and locked on the latter by means of a latching assembly, notably of the bayonet type.

BRIEF DESCRIPTION OF DRAWINGS

Other characteristics of a support device for a thin substrate according to the invention will become more apparent from the an following description of an embodiment, given as a indicative and non limiting example, with reference to the accompanying drawing wherein.

DETAILED DESCRIPTION OF A PREFERRED EMBODIMENT

Figure 2:
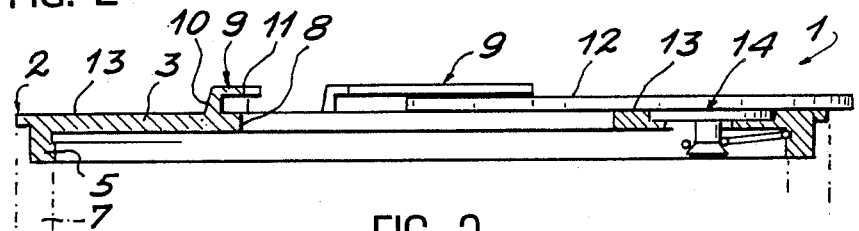
FIGS. 2 and 3 are transverse sectional views of this support, illustrating the manner in which the thin substrate is set in position on the latter.
Figure 3:
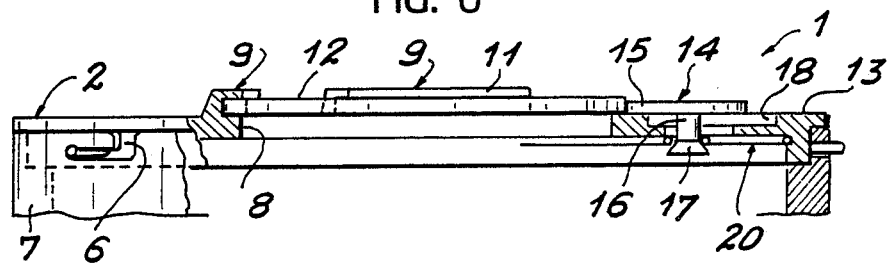

In the embodiment shown in the figures, reference 1 designates as a whole the support device in accordance with a preferred embodiment. The latter comprises a platen 2, having an upper bearing plane 3 placed preferably horizontally and including at its periphery radial fingers 4 extending from a flange 5 provided underneath plane 3. Fingers 4 are provided for cooperating with housings 6 to form a bayonet, in order to allow in a manner known per se the mounting and immobilization of the platen on a base 7, schematically shown in FIGS. 2 and 3.

Figure 1:
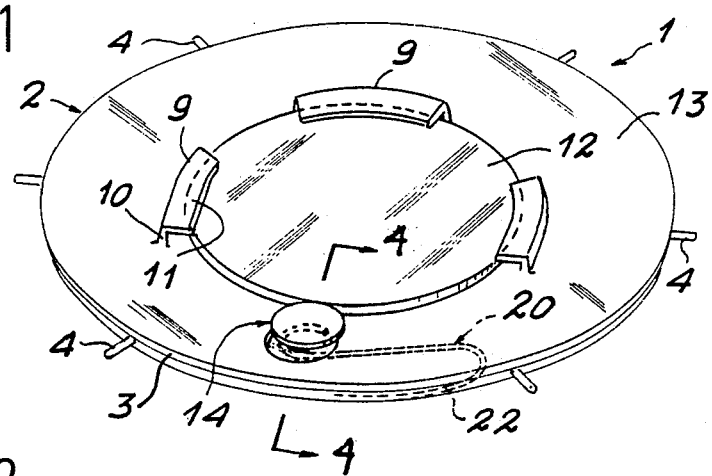
FIG. 1 is a perspective view of the support according to the invention.

Platen 2 includes, substantially in the center of plane 3, an open housing 8, defining a circular shaped central zone. On the other hand, it includes fixed abutments 9, three in number in the example under consideration, which as shown in FIG. 1 are distributed about the central zone of housing 8, two of them being diametrically opposite and the third being spaced apart and equidistant from the two others.

Each fixed abutment 9 is in the shape of an open rim including a first portion 10 extending substantially vertically above plane 3 and a second upper portion 11 extending from the first portion 10 and parallel to plane 3. The platen is provided for ensuring the immobilization of a substrate which is in the form of a thin circular plate 12, in an appropriate semiconductor material, adapted to be slided on the upper face 13 of the bearing plane 3 and coming thus in engagement underneath the upper portion 11 of abutments 9 until it comes to bear against the portion 10 of the latter. The diameter of plate 12 is slightly larger than that of the open housing 8 provided in the plane of the platen.

According to the invention, plate 12 thus positioned is definitely immobilized on the platen by means of a complementary stud 14 mounted on plane 3 in line with the third fixed abutment on the other side of housing 8, said stud 14 and the three fixed abutments 9 being thus placed at 90° with respect to one another around substrate 12.

Figure 4:
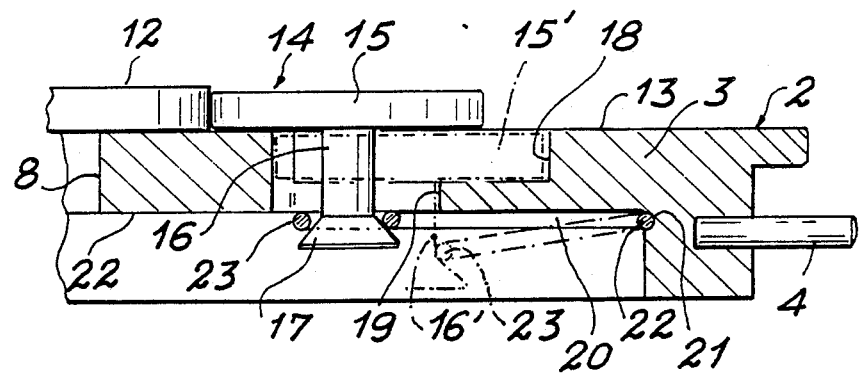
FIG. 4 is a detailed larger scale view of the support, which shows notably the characteristics and explains the mounting of the complementary immobilization stud.

Stud 14 is composed of a flat head 15 and of a vertical axis 16 situated underneath the latter, axis 16 having preferably an end flaring-out portion 17 of a slightly conical shape and the role of which will be made clear hereafter. Stud 14 is movably mounted inside a recess 18 formed in the platen plane 3 thickness, this recess having a transverse dimension which is substantially equal to that of the stud head 15. Recess 18 extends into a passage 19 (FIG. 4) through which freely passes axis 16, this passage having however a width less than that of head 15 to avoid the escape of the stud from platen 2.

Stud 14 is permanently subjected to the effect of a hairpin spring 20 as is shown schematically in FIG. 1. One of the branches 22 of the spring bears against the bottom of groove 21 formed in the platen 2 underneath of the plane 3 of the latter, while the other branch 23 forms preferably a loop surrounding the stem axis 16 above the flaring out formation 17, the conical shape of which retains the spring along this axis. The flaring-out formation 17 has also as a function, due to its conical shape, to have the spring 20 which is applied against it to constantly force the stud head 15 along plane 3 or on the bottom of recess 18 of platen 2.

The operation of the support device for a thin substrate such as hereabove described is easily inferred from this description and from the figures of the accompanying drawings.

Platen 2 being previously secured on its base 7, the thin plate 12 of the substrate is put in position underneath the rims of fixed abutments 9, stud 14 being, during this first phase, retracted inside recess 18, its head 15 being flush with the level of upper face 13. In the detailed view of FIG. 4, references 15' and 16' show notably the position of movable stud 14 thus engaged inside the recess. Once the plate 12 bears against the fixed abutments 9, the only thing to do is to free stud 14 which, under the effect of spring 20, is pushed back upwardly, the flat head 15 extending upper face 13 while coming at the same time against the edge of plaquette 12 and holding it against the opposite fixed abutment.

Thus is realized a particularly simple support device as regards its design as well as its operation. The setting in position of a plaquette forming a substrate can be effected automatically, the mobile immobilization stud blocking the plate in position once the latter is bearing against the fixed abutments which, in cooperation with the upper plane of the platen, provide for a perfectly horizontal substrate.

Of course, it goes without saying that the invention is not limited to the embodiment more specially described and shown hereabove; on the contrary, its encompasses all the variants thereof, and is described more particularly by the claims which follow.

We claim:

1. A support device for retaining a thin circular substrate of a semiconductor material having a plate-like shape comprising:

a platen having a central opening recessed with respect to a surface of said platen for receiving said substrate, said opening being bordered by a plurality of fixed abutments against which said circular substrate rests, said fixed abutments including a top planar portion parallel to said platen surface forming a partial rim for receiving an edge of said substrate;

a movable abutment having a flat head, said movable abutment supported for movement against an edge of said circular substrate and for axial movement into an opening in a supporting surface of said platen when said movable abutment is urged away from said circular substrate edge, permitting said circular substrate to be inserted or removed from said central opening; and, a spring connected to said platen and said movable abutment for urging said abutment axially out of said opening in said platen.

2. A device according to claim 1, wherein said fixed abutments are distributed on a face of the platen so as to come in contact with three separated points of said substrate, two of said abutments being positioned along a diameter of the substrate, and the third abutment positioned along a radius perpendicular to said diameter.

3. A device according to claim 1, wherein each rim of a fixed abutment defines between its top portion parallel to the platen surface and the platen a space the height of which is substantially equal to the substrate thickness.

4. A device according to claim 1, wherein said movable abutment has a lower end formed into a conical flared-out formation, opposite the flat head and against which bears said spring, said spring connected to the platen in an open groove formed in the latter outside the opening receiving the movable abutment.

5. A device according to claim 4, wherein said spring has the shape of a hairpin, with one branch bearing on the bottom of said groove and the other forming a loop surrounding the stud.

6. A device according to claim 1, wherein said platen is mounted on a fixed base and locked to it by means of a latching assembly of the bayonet type.

* * * * *